United States Patent [19]

Lu

[11] Patent Number: 5,548,218
[45] Date of Patent: Aug. 20, 1996

[54] FLEXIBLE RF COILS FOR MRI SYSTEM

[75] Inventor: Dongfeng Lu, Williston Park, N.Y.

[73] Assignee: North Shore University Hospital Research Corporation, Manhasset, N.Y.

[21] Appl. No.: 545,081

[22] Filed: Oct. 19, 1995

[51] Int. Cl.$^6$ .................................................. G01V 3/00
[52] U.S. Cl. ................................................... 324/318
[58] Field of Search .................................. 324/300, 307, 324/309, 318, 319, 320, 322; 335/216; 128/653.2

[56] References Cited

U.S. PATENT DOCUMENTS

| | | | |
|---|---|---|---|
| 4,793,356 | 12/1988 | Misic et al. | 324/318 |
| 4,816,765 | 3/1989 | Boskamp | 324/322 |
| 4,859,947 | 8/1989 | Boskamp | 324/318 |
| 4,910,461 | 3/1990 | Van Vaals | 324/322 |
| 4,920,318 | 4/1990 | Misic et al. | 324/318 |
| 5,030,915 | 7/1991 | Boskamp et al. | 324/318 |
| 5,091,708 | 2/1992 | Bezjak | 324/318 |
| 5,198,768 | 3/1993 | Keren | 324/318 |
| 5,241,272 | 8/1993 | Friedrich | 324/318 |
| 5,256,971 | 10/1993 | Boskamp | 324/318 |
| 5,258,717 | 11/1993 | Misic et al. | 324/318 |
| 5,285,160 | 2/1994 | Loss et al. | 324/318 |
| 5,394,087 | 2/1995 | Molyneaux | 324/318 |

OTHER PUBLICATIONS

Roemer et al., "Magnetic Resonance In Medicine", vol. 16, pp. 192–225 (1990), entitled The NMR Phased Array.
Kojima et al., Radiology 1995, 196:871–875.
Herlihy et al., SMRM 1993, p. 308.
Schnell et al., SMRM 1993, Poster.

*Primary Examiner*—Michael Tokar

[57] ABSTRACT

An RF coil construction for MRI apparatus and comprising, preferably, three butterfly coils extending in a longitudinal direction and overlapping with three single loop coils. Each of the three butterfly coils have flexible wings which can be wrapped over the body of a patient. The signals from two of the butterfly coils and two of the single loop coils are simultaneously processed in a phased array manner. The resultant RF coil construction provides in-depth imaging over a large FOV with a high SNR and good homogeniety, and is well suited for imaging the lower extremities of a patient without moving the patient or the coils. Further, the butterfly coils receive signals in the horizontal direction, and the single loop coils receive signals in the vertical direction. The combining of such signals realizes quadrature operation and improves the SNR. Also described is a mesh coil that can be operated to function as the equivalent of one butterfly coil and one single loop coil.

16 Claims, 6 Drawing Sheets

FLEXIBLE RF COILS FOR MRI SYSTEM

This invention relates to magnetic resonance imaging (MRI) systems, and in particular to the radio-frequency (RF) coil construction used in such systems.

BACKGROUND OF THE INVENTION

MRI systems are well known in the art and widely used in medicine and typically comprise a magnet system for generating a steady magnetic field, a magnet system for generating gradient fields, and an RF transmitter coil for generating an RF field which excites nuclei in a patient for magnetic resonance. The magnetic resonance signal is detected by the RF transmitter coil or by a special receive-only RF coil or coils. See, for example, U.S. Pat. Nos. 4,859,947; 4,920,318; 5,030,915; and 5,198,768, whose contents are incorporated herein by reference. The present invention is directed to the RF coil or coils for detecting the MRI signals.

Two important factors to evaluate an RF coil are signal-to-noise ratio (SNR) and homogeniety. The SNR is the ratio between the signal strength on the image and the background noise. An RF coil typically achieves a higher SNR when it is closer to the part of the patient being imaged. The homogeniety measures the geometric distortion generated by the RF coil. The receiving sensitivity generally decreases with increasing distance from the coil wires.

In magnetic resonance angiography (MRA) of the lower extremities of a patient, an RF coil is required to cover the blood vessels from pelvis to toe. The region required to be covered by the RF coil is referred to as the field of view (FOV). The commercially available MRI apparatus typically provides an RF coil (sometimes referred to as the body coil) that is large enough to cover the FOV of the lower extremities, but the MRI signals detected with such a coil have too low a SNR.

Another commercially available system uses either a torso flexible phased array coil or a knee coil but their FOVs are too small for the MRI study of the lower extremities. As a result, the MRI technologist has to move the coil and reposition the patient three times to cover the full lower extremities. This costs additional valuable MRI examination time, and is inconvenient for both the patient and the technologist.

A paper in the names of Roemer et al., published in "Magnetic Resonance In Medicine" vol. 16 pages 192–225 (1990), entitled "The NMR Phased Array", describes an array made up of a multitude of overlapping and closely positioned RF coils which can cover a wide region of interest. The example given is of four square overlapped fixed coils for imaging the spine. This system suffers from the drawback that it does not work well for structures deep in the body but is best for near-surface MRI as is needed for spine imaging.

For completeness' sake, a paper in the names of Kojima et al., published in Radiology 1995, 196:871–875, describes an RF phased array coil for imaging the lower extremities. This coil system comprises 6 butterfly type coils, of which each coil comprises a part under the patient and a part over the patient. But this system does not offer the advantage of quadrature operation with its higher SNR.

SUMMARY OF THE INVENTION

An object of the invention is an improved RF coil construction for MRI apparatus.

A further object of the invention is an improved RF coil construction for MRI apparatus and which can provide a large FOV with a high SNR.

Another object of the invention is an RF field coil construction capable of in-depth imaging with good homogeniety.

Still another object of the invention is an RF field coil construction that is convenient in use to both MRI technologists and patients.

In accordance with one aspect of the present invention, my novel RF coil construction comprises a butterfly coil having a fixed part for positioning under the patient and opposed flexible arms or wing parts that can be wrapped around the patient. The opposed flexible wing parts increase the sensitivity and SNR for in-depth imaging of patient body parts.

In accordance with another aspect of the present invention, my novel RF coil construction comprises at least two longitudinally-extending adjacent and edge-overlapping butterfly coils each having a fixed part for positioning under the patient and opposed flexible wings parts that can be wrapped around the patient.

In accordance with still another aspect of the present invention, my novel RF coil construction comprises, in combination with a butterfly coil having a fixed part for positioning under the patient and opposed flexible arms or wing parts that can be wrapped around the patient, a fixed single loop coil. The butterfly coil and single loop coil detect RF magnetic fields of othogonal directions to permit quadrature operation which can potentially increase the SNR by up to $\sqrt{2}$.

In accordance with still another aspect of the present invention, my novel RF coil construction comprises, in combination with at least two longitudinally-extending adjacent and edge-overlapping butterfly coils, at least two fixed single loop coils overlapping with the butterfly coils.

In a preferred embodiment, three butterfly coils that are longitudinally adjacent and edge-overlapped, with patient-underlying fixed and patient-overlying flexible wing parts, are combined in overlapping fashion with three fixed edge-overlapping single loop coils. The signals from two adjacent butterfly coils and two adjacent single loop coils of this combination of coils are simultaneously processed by the phased array scheme described in the Roemer paper to produce the MRI image. This combination will provide in-depth MRI imaging of a large FOV, and in particular, the whole FOV for MRI of the lower extemities of a patient, from his or her pelvis to the toes. In addition, the SNR and homogeniety are good. Further advantages are that the novel coil system allows easy positioning of the patient, is comfortable to the patient, and is sufficiently flexible to fit different patient sizes.

In accordance with yet another aspect of the present invention, my novel RF coil construction comprises a single mesh coil with flexible wings that can function both as a butterfly coil and as a single loop coil to obtain quadrature operation.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, like reference numerals or letters signifying the same or similar components.

DETAILED DESCRIPTION OF THE PREFERRED EMBODIMENTS

The coil constructions of the invention can be employed in any conventional MRI apparatus that contains circuitry for processing the coil signals as described in the Roemer paper. Details can be found in the referenced patents as well as in the Roemer paper. As will be evident from the references, the conventional system provides a main magnetic field in the longitudinal or Z direction (the direction in which the patient to be examined is typically oriented and over which the field of view extends), and gradient magnetic fields in the transverse or horizontal or X direction, the vertical or Y direction, and the Z direction (the X, Y and Z directions are mutually orthogonal). The X-Y plane is the plane perpendicular to the Z direction. In a typical setting, the X-Y plane would represent a cross-section of the patient part to be examined. The RF coil is oriented or shaped to pick up RF signals generated by RF magnetic field components in the X and Y directions produced by resonating nuclei of the patient. It is unnecesary to describe herein in any further detail such well-known apparatus as those skilled in the art will be well aware of how such well-known apparatus operates. The description will thus concentrate on my contribution of a novel RF coil construction to this well known apparatus.

Figure 1:
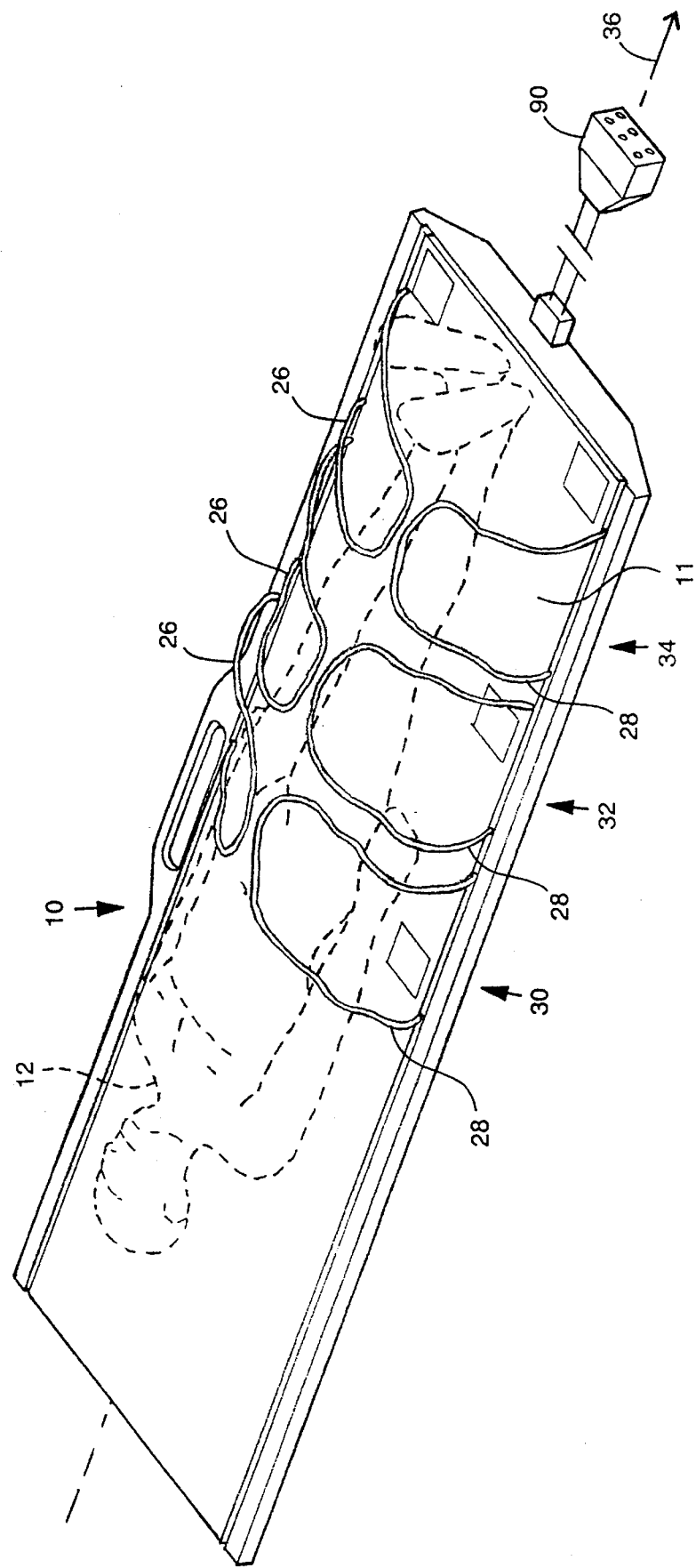
FIG. 1 is a perspective view of a typical frame for supporting a patient for MRI and containing one form of RF coil construction in accordance with the invention.
Figure 2:
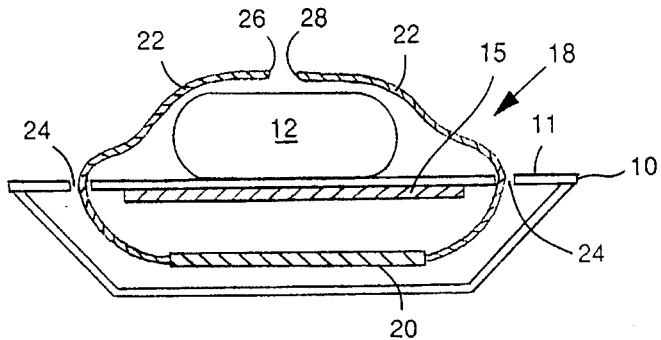
FIG. 2 is a cross-section through the frame of FIG. 1 showing schematically the positioning of the RF coil construction in accordance with the invention.

FIG. 1 illustrates a conventional frame 10 for supporting on a surface 11 a patient 12 for MRI examination of the patient's lower extremities. The RF coils (only the flexible part of which is shown in FIG. 1) have their fixed parts embedded inside the frame 10. FIG. 2 is a schematic cross-section of the frame 10 containing on its interior, adjacent the top surface 11 of the frame, a set of single loop coils 15 whose plane is horizontal and parallel to the frame surface 11. Located beneath the set of single loop coils 15 is a set 18 of butterfly coils each constituted of a fixed part 20 whose plane is parallel to that of the single loop coils 15 and flexible arm parts 22 that extend through slots 24 in the frame and form opposed flexible wings that are sized to extend over and cover the body of the patient 12. The flexible wings should be positioned over the patient such that the distal ends 26, 28 do not overlap.

Figure 3:
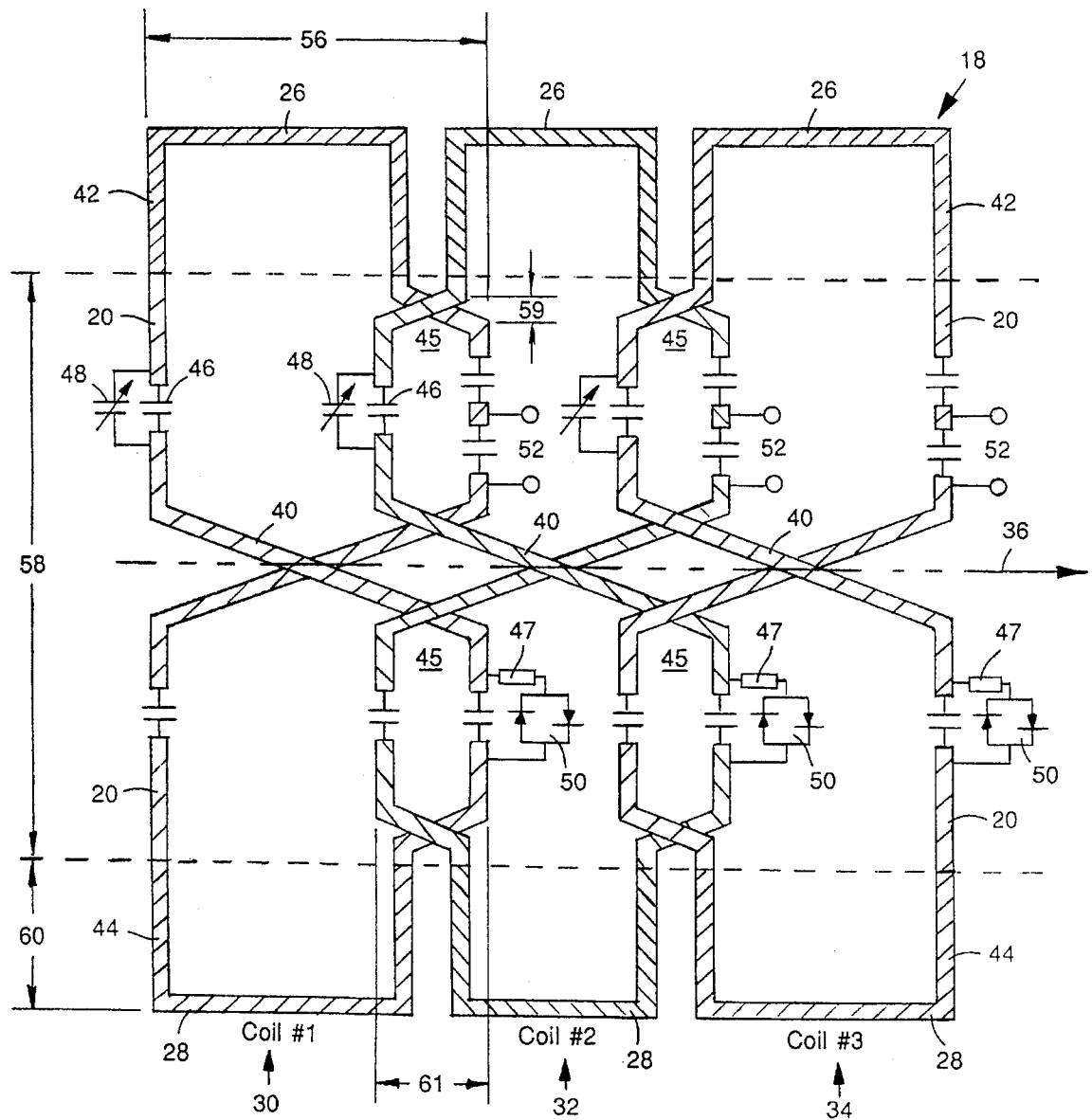
FIG. 3 is a plan view of the butterfly coils part of the RF coil construction of FIG. 2.

FIG. 3 illustrates, not to scale, one form of a set 18 of butterfly coils in accordance with the invention. In this exemplary embodiment, the set comprises three individual coils 30, 32, 34 that are arranged adjacent one another in the longitudinal (Z) axis 36 of the coil construction. A butterfly coil, as is well known, is a twisted loop. In the embodiment of FIG. 3, each butterfly coil comprises a fixed part 20, which contains the twist 40, and opposed, laterally extending flexible parts 42, 44. The edges of the fixed parts 20 overlap as shown at 45 to reduce inductive coupling. The flexible parts 42, 44 of each coil are shown with the same direction of hatching of their respective coil but hatching that is wider spaced. In addition, in series with each coil are fixed 46 and variable 48 capacitors for tuning the coils to the resonant condition, which is conventional, and also in series an inductor 47 with back-to-back diodes 50 which, as is well known, act as a protection circuit to prevent build-up of excessive current during excitation of the transmission RF field. To avoid undesirable interactions, the coil parts that cross are protected by suitable insulation or are located under insulating electronic tape. The coil outputs are indicated by the small circles designated 52.

The butterfly coil dimensions of the exemplary embodiment are indicated in FIG. 3. All three coils 30, 32, 34 have approximately similar dimensions and are positioned symmetrically with respect to the longitudinal axis 36. In their length direction, each coil, at its longest fixed part indicated by reference numeral 56, is about 15.75 inches. In the transverse width direction, indicated by reference numeral 58, the fixed coil width is about 12.5 inches or 6.25 inches from the longitudinal axis 36. The width of each flexible part, indicated by reference numeral 60, is about 9 inches. The overall length of the three butterfly coils is about 45 inches, which is sufficient to cover the lower extremities of most patients. These values are exemplary only and are not meant to be limiting. The butterfly coils are labelled coil #1 for the coil closest to the head of the patient, and coil #2 and coil #3 as the coils extend toward the patient's feet. The other two dimensions shown, referenced 59, 61, are about 0.5 and 1 inches, respectively.

Figure 4:
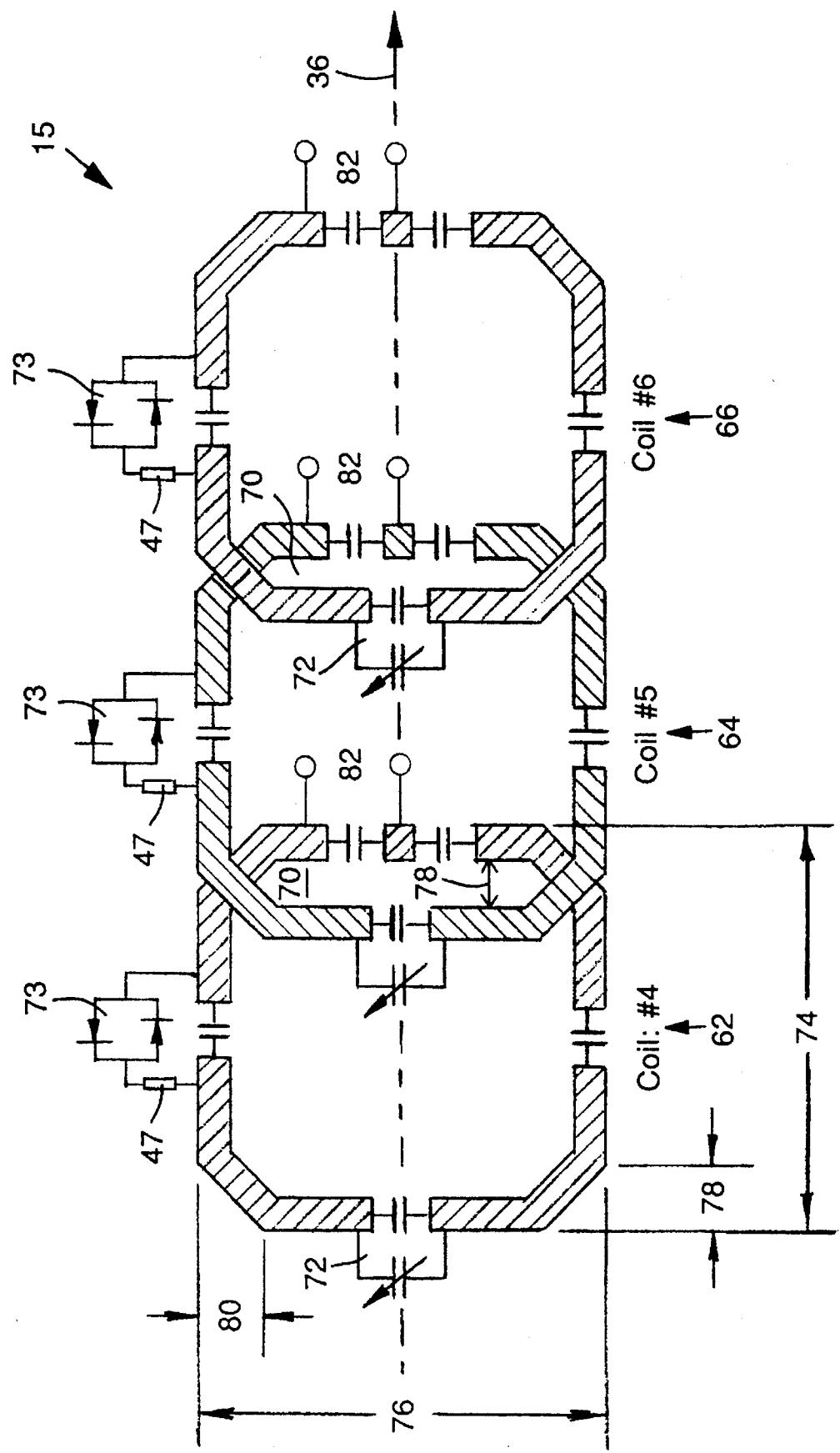
FIG. 4 is a plan view of the single loop coils part of the RF coil construction of FIG. 2.

FIG. 4 illustrates, not to scale, one form of a set 15 of single loop coils in accordance with the invention. Each coil, in essence, is a square loop, flat coil. In this exemplary embodiment, the set comprises three individual coils 62, 64, 66 that are arranged adjacent one another in the longitudinal axis 36 of the coil construction. The coil's edges overlap, shown at 70, to reduce, as is well known, inductive coupling. The overlap area is about 10% of the overall loop area. Capacitors 72 are provided in series as well as back-to-back diodes 73 for protection of the coils. The arrangement is similar to, and functions similarly to, that depicted in FIG. 14 of the Roemer paper, except that only three single-loop coils are provided. The length of each coil, indicated by reference numeral 74, is about 16 inches, and the width, indicated by reference numeral 76, is about 13 inches. The longitudinal overlap, indicated by reference numeral 78, is about 2.25 inches, and the bevelled corners have longitudinal dimensions of about 3 inches and width dimensions of about 2 inches, indicated by reference numerals 78, 80, respectively. The overall coil length is about 43.8 inches. Both sets of coils 15, 18 are in an overlapping and symmetrical relationship and occupy in the longitudinal direction a space of close to 45 inches. While not essential, the two sets of coils 15, 18 should, preferably, have approximately the same longitudinal extent, should overlap, and at least cover the region of interest to be imaged.

As will be further observed from FIG. 2, the two sets of coils 15, 18 are located in overlapping relationship with longitudinal axes 36 that are parallel and aligned in a vertical plane, and with the single loop coils 15 closer to the patient. The two coil sets are also arranged symmetrically in their length direction, with the center of the single loop coil set 15 vertically aligned with the center of the set 18 of butterfly coils. The coupling between the butterfly coils set and the single loop coil set are minimized by positioning the butterfly coils symmetrically below the single loop coils. The three longitudinally-overlapped coils increases the maximal FOV of the RF coil without sacrificing the SNR or homogeniety. As in FIG. 3, the single loop coils in FIG. 4 are labelled from the patient's head downward as coils #4, #5, #6. The output connections to each of the single loop coils are shown at 82.

Figure 5:
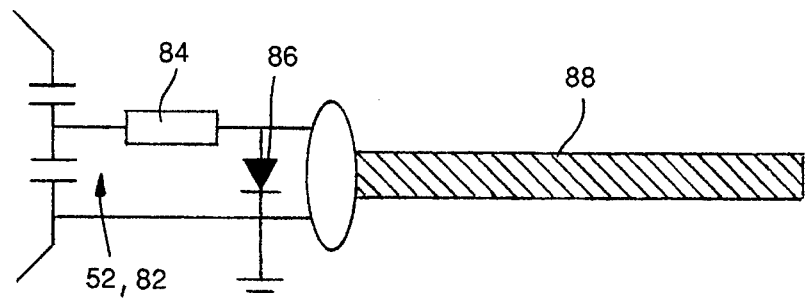
FIG. 5 is a schematic of the output circuitry connected to each of the coils of FIGS. 3 and 4.

FIG. 5 shows a typical output connection from across a capacitor of each of the six coils. An inductor 84 is connected via a diode 86 to a signal coaxial cable 88 tuned to ½ of the wavelength of the resonant frequency. The cables terminate at a multi-conductor connector 90 which carries the signal generated in each coil to a conventional preamplifier 92 (FIG. 6), from which the outputs are coupled to a computer controlled processor 94 which combines and processes the signals from an adjacent pair of butterfly coils and single loop coils simultaneously. The signals from the four coils are combined in the same way as described in the Roemer paper, which is a phased array combination with magnitude weighing. The butterfly coils 18 pick-up signals from the horizontal component of the field, and the single loop coils 15 pick-up signals from the vertical component, thus 90° out of phase.

Figure 7:
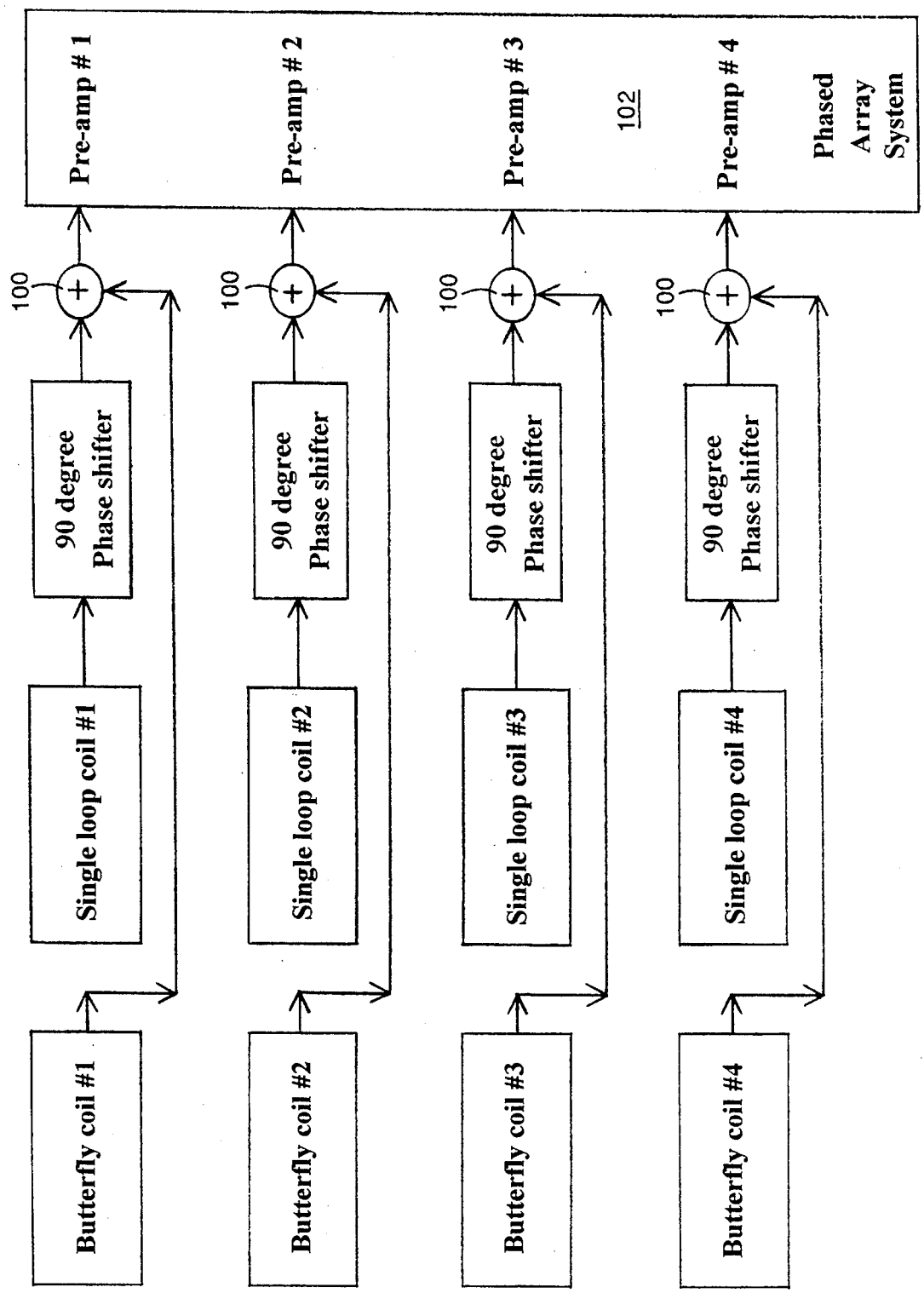

If these signals are combined directly before the preamplifiers, either the vertical signal or the horizontal signal has to be phase shifted by 90° before combining. FIG. 7 illustrates this scheme with sets of four butterfly coils and single loop coils forming four coil pairs each containing one butterfly coil (#1–#4) and the corresponding overlapping single loop coil (#1–#4). As shown in FIG. 7, the signals from each pair of coils, phase shifted 90°, is combined in an adder 100 before processing 102 by preamplifiers and suitable software to produce the MRI image.

The phased array system described by Roemers uses 4 preamplifiers to sample signals simultaneously from up to 4 coils. The processing uses the sum of magnitude square technique which combines the magnitudes squared of the signals from the 4 coils. Because in this system the square of magnitude is insensitive to the phase characteristic of the signal, the vertical and horeizontal signals can be combined directly after the preamplifiers without a 90° phase shifter (see FIG. 6). However, the 90° phase shifter is necessary when more than 4 coils are processed simultaneously.

When coils are present producing signals representative of both the vertical and horizontal field components that contribute to the image, the system is sometimes referred to as a quadrature coil system which provides improved SNR.

The essence of the phased array coil operation is to use up to four coils simultaneously and combine the signals from these coils to increase the FOV and SNR. In my novel RF coil construction, I use coils labelled in FIGS. 3 and 4 #1 (butterfly), #2 (butterfly), #4 (single loop), and #5 (single loop) simultaneously to image the pelvis and upper thigh, and I use coils #2 (butterfly), #3 (butterfly), #5 (single loop), and #6 (single loop) simultaneously to image the lower thigh and leg, without having to move the coils relative to the patient or vice-versa. For this embodiment, I use nine serially-connected capacitors (6 at 37 pf, 2 at 45 pf, and 1 at 71 pf) on the single loop coils, and twelve serially-connected capacitors (5 at 45 pf, 2 at 10 pf, 2 at 14.7 pf, and 2 at 45 pf) on the butterfly coils. The total capacitance on the single loop coils is 4.53 pf, and that of the butterfly coils is 1.94 pf.

The preferred embodiment uses three butterfly coils and three single loop coils, which performs well for MRI of the lower extremities. However, the invention is not limited to the combination of a set of three butterfly coils and a set of three single loop coils. To further increase the SNR and homogeniety, the number of coils in each set can be increased to six, each approximately one-half the length of the coils when in sets of three for the same FOV. The signals of each single loop coil can be directly combined with the signals of the immediately overlapping butterfly coil after a 90° phase shift as illustrated in FIG. 7. This results in one combined signal from each pair of butterfly coil and single loop coil. Four pairs of butterfly coils and single loop coils (8 coils) can thus be processed simultaneously by the phased array system shown with four preamplifiers. With six pairs, then the first four pairs would be processed followed by the last four pairs, producing a single combined image covering the full FOV.

Figure 6:
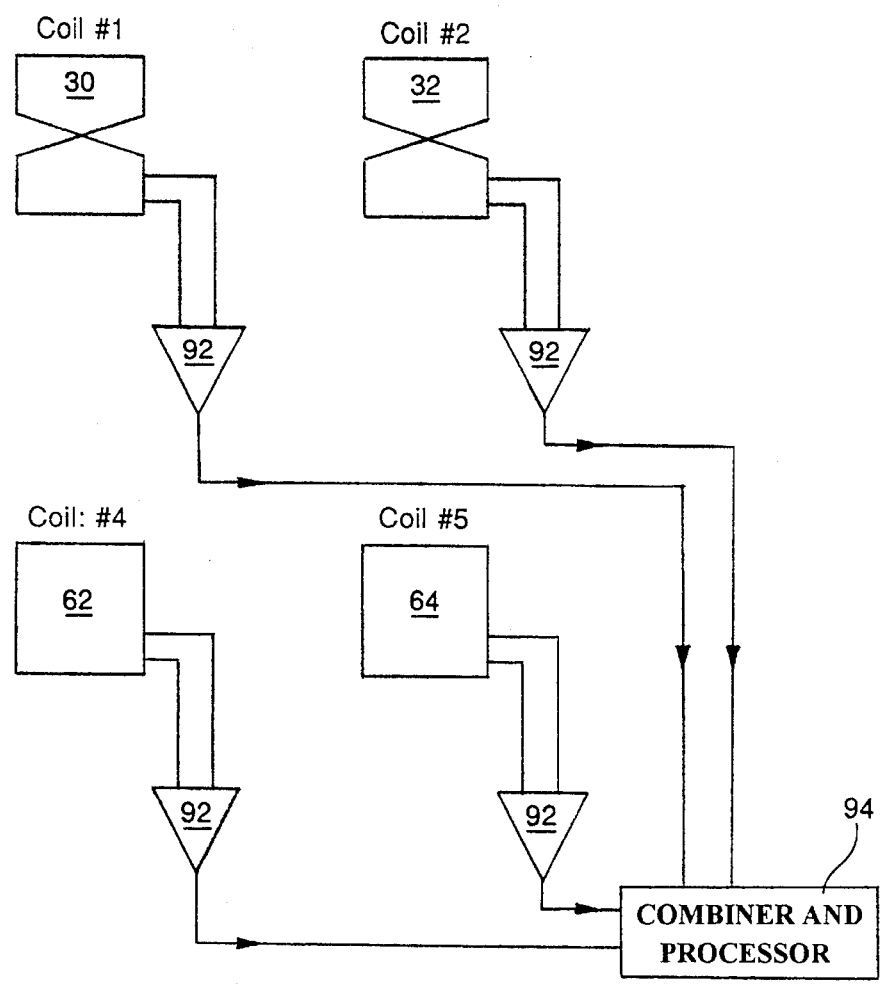
FIGS. 6 and 7 are schematics illustrating ways of processing of the signals generated by coil constructions of the invention.

Also, each set of coils can contain only one coil, i.e., one butterfly coil with flexible wings and one single loop coil for a small FOV. In this latter case, the signals from both of the coils would be processed simultaneously by the phased array system or combined directly after a 90° phase shift. Preferably, each set contains at least two butterfly coils and two single loop coils extended in the longitudinal direction as indicated in FIGS. 3 and 4, which is also shown in FIG. 6. The two coils would be overlapped as indicated in FIG. 2. Coils with the dimensions of the preferred embodiment would provide a FOV adequate to image the chest and heart of a patient. In this case, the signals from the four coils would be combined as described above.

Figure 8:
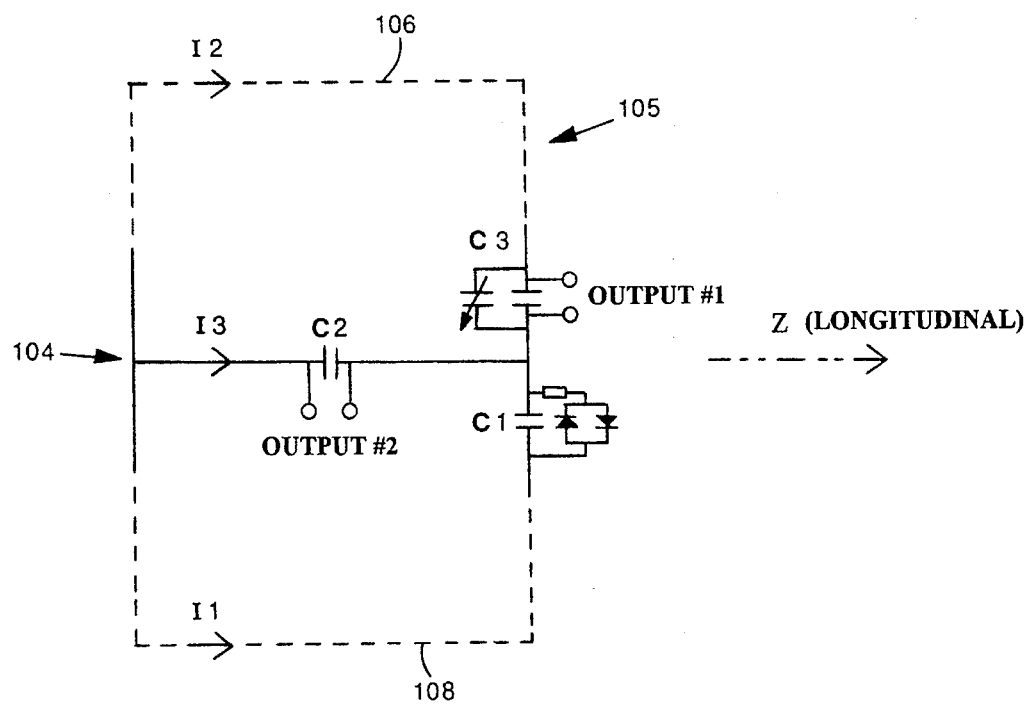
FIGS. 8 and 9 are plan views of a single mesh coil and multiple mesh coils, respectively, of another form of RF coil construction in accordance with the invention.

As a further modification, a single mesh coil can be provided to function as a pair of one butterfly and one single loop coil. This modification 105 is illustrated in FIG. 8. It comprises a fixed solid coil part 104 (shown by the solid lines) and opposed flexible wing parts 106, 108 (shown by the dashed lines). The mesh forms a center conductor in which signal current I3 flows and two outer conductors in which signal currents I1 and I2 flow. The usual capacitors C1, C2, and C3 are provided for tuning purposes, and an inductor L and protection diodes. In this embodiment, two outputs #1 and #2 are provided. The mesh coil has two modes of resonance. Mode #1 is the equivalent of single loop coil operation and requires that $I1=-I2$, and $I3=0$. The output is then taken from output #1 for this single loop coil mode. Mode #2 is the equivalent of butterfly coil operation and requires that $I1=I2=(-I3/2)$. The output is then taken from output #2 for this butterfly coil mode. By adjusting the capacitors C1, C2, C3, the two resonant modes can occur at the same resonant frequency. In this way, the one mesh coil 105 can function as a pair of butterfly and single loop coils.

When both modes are in resonance, the signals S2 from output #2 contains only the horizontal signal $S_h$ similar to that obtained from a butterfly coil. However, the signals S1 from output #1 contains contributions from both the horizontal signals $S_h$ and the vertical signals $S_v$ with values $(-S_h/2+S_v)$. The vertical signal can thus be obtained by the computation (S1+S2/2), which can be accomplished by a signal combiner. It may also be achieved using the phased array system to sample and process S1 and S2 simultaneously before the sum of magnitude square operation. The FOV of the single mesh coil may be limited to imaging small body sections, such as the heart.

Figure 9:
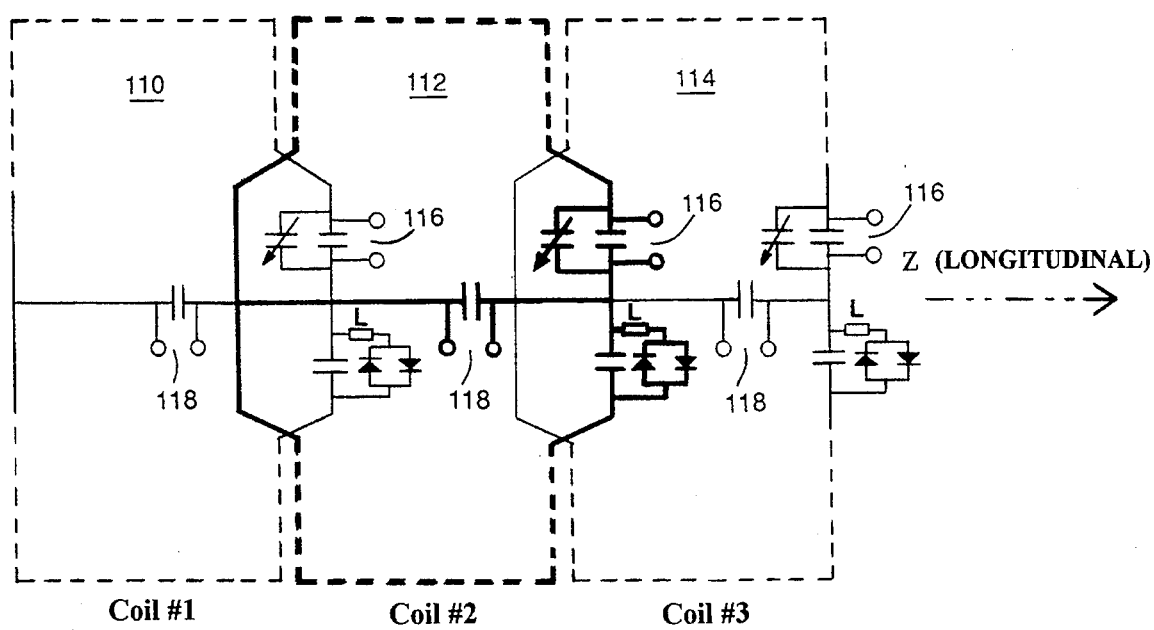

As illustrated in FIG. 9, three mesh coils 110, 112, 114, of the type shown in FIG. 8, can be arranged to extend in the longitudinal (Z) direction to produce a larger FOV for MRI of the lower extremities. The corresponding signal outputs #1 are designated 116, and the corresponding signal outputs #2 are designated 118. Adjacent coil edges should overlap to reduce inductive coupling. To illustrate more clearly the individual mesh coils, the center one 112 is shown in thicker lines, and the outer ones 110, 114 are shown in thinner lines. The signals from two pairs of mesh coils can be processed simultaneously with the phased array system. It is also possible to employ six longitudinally extending mesh coils and use four of them simultaneously as illustrated in FIG. 7.

In its broadest aspects, the invention contemplates an RF coil system comprising N (an arbitrary integer) pairs of butterfly and single loop coils. When N=1, the RF coil can be used to image a smaller FOV, such as the heart, and does not need the phased array system to process signals. When N=2, to use two pairs of coils simultaneously, the phased array system can be used to process signals without a 90° phase shifter. When N>2, to use three or more pairs of coils simultaneously, the phased array system should be used to process signals together with 90° phase shifters.

The flexible wire parts 26 of the butterfly coils are preferably constituted of flexible coaxial cables with the outer shield connected to the inner wire to provide a more desirable distribution of capacitance. In an exemplary embodiment, not to be considered limiting, the cable outer diameter was 5 mm. An advantage of the flexible coil parts is their ductility and thus their ability to be re-shaped to fit the body contour of differently sized and shaped patients.

In summary, my novel RF coil construction features a large imaging volume so that a large FOV from pelvis-to-toe can be studied without moving the patient. The preferred embodiment was tested on a clinical whole body scanner, Model No. Signa-1.5 Tesla, operating at 5.4 software level, made by General Electric, and provides a SNR that is about 300% higher than that of the conventional body coil, and its homogeniety is better than the torso phased array coil. The flexible wings on both sides of the butterfly coils are made of flexible conductive wires which are easily wrapped around the patient's body during MRI. This arrangement makes it easy for the MRI technologist to position the patient and is comfortable for the patient. Furthermore, the flexible wires can fit different patient body sizes.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A flexible RF coil construction for MRI over a field of view extending in a longitudinal direction, comprising:
   (a) at least one butterfly coil for generating signals representative of a horizontal component of an RF magnetic field produced by resonating nuclei and at least one single loop coil for generating signals representative of a vertical component of the RF magnetic field, the directions of said horizontal and vertical magnetic field components being orthogonal to said longitudinal direction,
   (b) means for combining the signals from the butterfly and single loop coils in quadrature for subsequent processing to form a magnetic resonance image,
   (c) said butterfly coil comprising a fixed first part arranged symmetrically with respect to the single loop coil and positioned to extend under a patient body part to be examined,
   (d) said butterfly coil comprising opposed flexible second parts connected to the first part and configured to be wrapped over the body part of the patient to be examined.

2. A flexible RF coil construction for MRI over a field of view extending in a longitudinal direction, comprising:
   (a) at least N butterfly coils arranged adjacent one another and extending in the longitudinal direction and each for generating signals representative of a horizontal component of an RF magnetic field produced by resonating nuclei,
   (b) at least N single loop coils arranged adjacent one another in the longitudinal direction or parallel thereto each for generating signals representative of a vertical component of the RF magnetic field, said single loop coils being symmetrically arranged with respect to the butterfly coils and in overlapping relationship with the butterfly coils, the directions of said horizontal and vertical magnetic field components being orthogonal to said longitudinal direction,
   (c) means for combining the signals in quadrature of at least one pair of butterfly coils and single loop coils for simultaneous processing to form a magnetic resonance image,
   (d) each of said butterfly coils comprising a fixed first part positioned to extend under a patient body part to be examined,
   (e) each of said butterfly coils comprising opposed flexible second parts configured to be wrapped over the body part of the patient to be examined,
   (f) N being an integer.

3. The RF coil construction of claim 2, wherein two butterfly coils are provided and the fixed parts of the two butterfly coils have their adjacent edges overlapping.

4. The RF coil construction of claim 2, wherein two single loop coils are provided and the two single loop coils have their adjacent edges overlapping.

5. The RF coil construction of claim 2, wherein N=2, and the means for combining comprises a phased array system.

6. The RF coil construction of claim 2, wherein N>2, and the means for combining comprises a phased array system and 90° phase shifters.

7. A flexible RF coil construction for MRI over a field of view extending in a longitudinal direction, comprising:
   (a) three butterfly coils arranged adjacent one another in a longitudinal direction and each for generating signals representative of a horizontal component of an RF magnetic field produced by resonating nuclei,
   (b) three single loop coils arranged adjacent one another in the longitudinal direction and each for generating signals representative of a vertical component of the RF magnetic field, the directions of said horizontal and vertical magnetic field components being orthogonal to said longitudinal direction, said single loop coils being symmetrically arranged with respect to the butterfly coils and in overlapping relationship with the butterfly coils,
   (c) means for combining the signals in quadrature of at least two adjacent butterfly coils and two adjacent single loop coils for simultaneous processing to form a magnetic resonance image,
   (d) each of said butterfly coils comprising a fixed first part positioned to extend under a patient body part to be examined,
   (e) each of said butterfly coils comprising opposed flexible second parts configured to be wrapped over the body part of the patient to be examined.

8. The RF coil construction of claim 7, wherein the three single loop coils extend in a horizontal plane and are positioned in a fixed relationship under the patient to be examined.

9. The RF coil construction of claim 8, wherein the fixed parts of the three butterfly coils extend in a horizontal plane and are positioned in a fixed relationship under the patient to be examined with the three single loop coils extending between the patient and the three butterfly coils.

10. The RF coil construction of claim 9, wherein adjacent edges of the fixed parts of the three butterfly coils are in overlapping relationship.

11. The RF coil construction of claim 10, wherein adjacent edges of the three single loop coils are in overlapping relationship.

12. The RF coil construction of claim 10, further comprising a capacitor network connected to each of the coils.

13. The RF coil construction of claim 10, wherein the means for combining includes means for phase-shifting.

14. The RF coil construction of claim 10, wherein the means for combining includes a phased array system.

15. A flexible RF coil construction for MRI, comprising:

(a) a first mesh coil comprising first and second outer branches for carrying currents I1 and I2, respectively, and a center branch for carrying current I3, (b) said center branch comprising a fixed first part positioned to extend under a patient to be examined, (c) each of said outer branches comprising flexible second parts configured to be wrapped over the body of the patient, (d) said mesh coil having first and second modes of resonance,
 (i) in the first mode of resonance, I1=−I2, and I3=0 and is the equivalent of single loop coil operation,
 (ii) in the second mode of resonance, I1=I2=(−I3/2) and is the equivalent of butterfly coil operation, (e) means connected to the mesh coil for deriving two outputs each associated with the first and second modes, (f) means connected to the mesh coil for making the first and second modes resonant at the same frequency, (g) means for combining signals from the two outputs for subsequent processing to form a magnetic resonance image.

16. The flexible RF coil as claimed in claim 15, further comprising second and third mesh coils configured similarly to that of the first mesh coil and positioned adjacent to the latter to extend the FOV.

* * * * *